US012794527B2

(12) United States Patent
Laporte et al.

(10) Patent No.: US 12,794,527 B2
(45) Date of Patent: Nov. 10, 2026

(54) FORWARD DISTORTION CORRECTION FOR TIME DOMAIN BEAMFORMING

(71) Applicant: Telefonaktiebolaget LM Ericsson (publ), Stockholm (SE)

(72) Inventors: Pierre-Andre Laporte, Gatineau (CA); Jayamuni Silva, Nepean (CA)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 340 days.

(21) Appl. No.: 18/685,061

(22) PCT Filed: Aug. 31, 2021

(86) PCT No.: PCT/IB2021/057967

§ 371 (c)(1),
(2) Date: Feb. 20, 2024

(87) PCT Pub. No.: WO2023/031648

PCT Pub. Date: Mar. 9, 2023

(65) Prior Publication Data

US 2025/0132797 A1 Apr. 24, 2025

(51) Int. Cl.
*H04B 7/06* (2006.01)
*H03H 17/02* (2006.01)
*H03H 11/04* (2006.01)

(52) U.S. Cl.
CPC ....... *H04B 7/0617* (2013.01); *H03H 17/0211* (2013.01); *H03H 2011/0488* (2013.01)

(58) Field of Classification Search
CPC .......... H04B 7/0617; H04B 2001/0425; H04B 1/0483; H03H 17/0211; H03H 2011/0488; H04L 1/0042

(Continued)

(56) References Cited

U.S. PATENT DOCUMENTS

2002/0131580 A1* 9/2002 Smith .................... H04R 3/005 381/122
2009/0170444 A1* 7/2009 Retnasothie ......... H04B 1/0039 455/73

(Continued)

FOREIGN PATENT DOCUMENTS

CN 108574459 A 9/2018

OTHER PUBLICATIONS

International Search Report and Written Opinion dated Jun. 1, 2022 filed in PCT Application No. PCT/IB2021/057967 filed Aug. 31, 2021, consisting of 14 pages.

(Continued)

*Primary Examiner* — Mang Hang Yeung
(74) *Attorney, Agent, or Firm* — Weisberg I.P. Law, P.A.

(57) ABSTRACT

A method and network node for forward distortion correction for time domain beam forming are provided. According to one aspect, a method in a network node includes filtering each signal output by the time domain beamformer by a band stop filter, the band stop filter including a stop band overlapping a pass band of the signal output by the time domain beamformer. The method also includes filtering each signal output by the time domain beamformer by a group delay filter in electrical parallel with a band stop filter, the group delay filter providing a group delay to the signal output by the time domain beamformer. The method also includes subtracting an output of each band stop filter from an output of a corresponding group delay filter.

22 Claims, 12 Drawing Sheets

(58) Field of Classification Search
USPC .......................................................... 370/329
See application file for complete search history.

(56) References Cited

U.S. PATENT DOCUMENTS

| | | | | |
|---|---|---|---|---|
| 2017/0359109 | A1* | 12/2017 | Baldemair | H04B 7/0456 |
| 2020/0212975 | A1* | 7/2020 | Jelonnek | H03F 1/3241 |

OTHER PUBLICATIONS

P.P. Vaidyanathan et al., "A New Approach to the Realization of Low-Sensitivity IIR Digital Filters", IEEE Transaction on Acoustics, Speech, and Signal Processing, vol. Assp-34. No 2, Apr. 1986, consisting of 12 pages.
M. Lang et al., "Simple and Robust Method for the Design of Allpass Filters Using Least-Squares Phase Error Criterion", IEEE Transactions on Circuits and Systems—II: Analog and Digital Signal Processing, vol. 41, Jan. 1994, consisting of 9 pages.
T. Saramaki, "On the Design of Digital Filters as a Sum of Two All-Pass Filters," in IEEE Transactions on Circuits and Systems, vol. 32, No. 11, Nov. 1985, consisting of 3 pages.
H. Schussler et al., "On the Design of Recursive Hilbert-Transformers," in Proc. International Conference on Acoustics, Speech, and Signal Processing (ICASSP'87)., 1987, consisting of 4 pages.

* cited by examiner

FORWARD DISTORTION CORRECTION FOR TIME DOMAIN BEAMFORMING

CROSS-REFERENCE TO RELATED APPLICATION

This application is a Submission Under 35 U.S.C. § 371 for U.S. National Stage Patent Application of International Application Number: PCT/IB2021/057967, filed Aug. 31, 2021 entitled "FORWARD DISTORTION CORRECTION FOR TIME DOMAIN BEAMFORMING," the entirety of which is incorporated herein by reference.

TECHNICAL FIELD

Wireless communication and in particular, to forward distortion correction for time-domain beamforming in wireless communication systems.

BACKGROUND

The Third Generation Partnership Project (3GPP) has developed and is developing standards for Fourth Generation (4G) (also referred to as Long Term Evolution (LTE)) and Fifth Generation (5G) (also referred to as New Radio (NR)) wireless communication systems. Such systems provide, among other features, broadband communication between network nodes, such as base stations, and mobile wireless devices (WD), as well as communication between network nodes and between WDs. Sixth Generation (6G) wireless communication systems are also under development.

Wireless communication systems according to the 3GPP may include one or more of the following channels:

A physical downlink control channel, PDCCH;

A physical uplink control channel, PUCCH;

A physical downlink shared channel, PDSCH;

A physical uplink shared channel, PUSCH;

A physical broadcast channel, PBCH; and

A physical random access channel, PRACH.

Fifth generation (5G) wireless systems introduced massive multiple input multiple output (MIMO) technology to further improve the spectral efficiency of mobile communication networks. Base station architectures have fundamentally been impacted as the number of antenna increased approximately by one order of magnitude together with the associated number of transceiver chains. This paradigm shift introduced some challenges to the design of radio products. As a result, radio size and power consumption are of concern to network equipment vendors.

Full digital beamforming offers flexibility since every subcarrier can potentially be beamformed using a unique set of weights in both the vertical and the horizontal dimensions. FIG. 1 illustrates an example of a 5G radio processing chain using full digital beamforming. For every subcarrier, the K MIMO layers are mapped to the N antennas using a digital beamformer. The total number of antennas is $N=N_1\times N_2$, where $N_1$ is the number of horizontal antennas and $N_2$ is the number of vertical antennas.

Following the frequency-domain (FD) digital beamformer, N parallel processing chains are needed to upconvert the signal to the RF frequencies. The digital radio processing includes operations that are computationally intensive such as the inverse Fast Fourier transformation (IFFT), channel filtering, sample rate up-conversion (↑N), Crest Factor Reduction (CFR), digital predistortion (DPD), digital to analog conversion (DAC), analog processing, and band filtering.

To mitigate the hardware complexity challenge, hybrid beamforming methods such as constrained digital beamforming may be utilized to reduce the amount of digital processing. For example, some digital time-domain (TD) beamforming (BF) weights can be applied later in the processing chain as illustrated in the example of FIG. 2. In FIG. 2, the time-domain beamforming weights are applied by the time domain beam former 4 positioned electrically in series between the CFR circuits 6 and the Digital Pre-Distortion (DPD) modules 8, thus reducing the number of processing chains from N to M between the FD beamformer 2 and the TD beamformer 4. In some embodiments, M is configured to correspond to $N_1$, the number of horizontal antenna ports.

Typically, the beamforming weights are updated on a symbol or on a slot basis, an example of which is illustrated in FIG. 3. When the beam weights are applied in the time-domain, the sudden coefficient change at the symbol or slot boundary creates a discontinuity which causes some spectral regrowth, as shown in the example of FIG. 4. In FIG. 4, trace A is the power spectral density (PSD) before time domain beam forming. Trace B is the PSD after symbol-based time domain beam forming. Trace C is the PSD after slot-based time domain beam forming. The dashed line D is a mask requirement of the United Stated Federal Communication Commission (FCC).

The distortion shown in FIG. 4 that is close to the carrier cannot be removed as the channel filter is located upstream of the TD beamformer. This may lead to unsatisfactory radio performance that fails to meet the regulatory operating band unwanted emission (OBUE) requirement masks, such as those from the 3GPP or regulatory agencies.

To alleviate this problem, one approach includes providing circuitry 9 to insert zeros within the cyclic prefix prior to the channel filter, as illustrated in the example of FIG. 5. The baseband zero insertion may be done by smoothly ramping the signal down, or by simply zeroing the signal using a step function. The baseband zero insertion method does help improve the spectrum. FIG. 6 shows an example of the spectrum before and after applying the time-domain beamforming using known methods for a NR 20 MHz carrier. The beamforming coefficients are updated at a symbol-level rate.

In FIG. 6, the trace A shows the spectrum when zeros replace 50% of the cyclic prefix. While this arrangement may meet the U.S. Federal Communication Commission (FCC) requirement mask (with little margin), this arrangement fails to meet other requirements such as the Korean B42 spurious emission mask. The trace B shows the spectrum when zeroing 93% of the cyclic prefix. In this example, both the U.S. FCC and Korean requirement masks are met, but there is very little margin left for random variations or other sources of impairment. In addition, such a long zeroing length will impact the link-level performance, especially when the channel delay spread is large.

SUMMARY

Some embodiments advantageously provide a method and system for forward distortion correction (FDC) for time-domain beamforming. Some embodiments mitigate the spectral regrowth that is produced by time-domain beam switching activity.

In some FDC methods disclosed herein, non-linear distortion may be isolated using fast transition band digital filters and then subtracted from the signal such that the emission masks are met with sufficient margins, even when using symbol-based switching, for the narrower carrier bandwidths, and with high power spectral density (PSD).

Some embodiments may have at least one of the following advantages:

The requirement masks are met with sufficient margins, even when using high PSDs combined with symbol-level beam switching;

The emission requirement masks can be met with the narrower carrier types, which are typically more challenging due to a shorter cyclic prefix; and/or Some embodiments achieve a shortened zero insertion length while meeting the requirement masks, thus improving the link-level performance.

According to one aspect, a method in a network node configured to communicate with a wireless device is provided. The method includes filtering each signal output by a time domain beamformer by a band stop filter, the band stop filter including a stop band overlapping a pass band of the signal output by the time domain beamformer. The method also includes filtering each signal output by the time domain beamformer by a group delay filter in electrical parallel with a band stop filter, the group delay filter providing a group delay to the signal output by the time domain beamformer. The method further includes subtracting an output of each band stop filter from an output of a corresponding group delay filter.

According to this aspect, in some embodiments, the method further includes inserting zeros to a signal that is processed to be input to the time domain beamformer to achieve a specified level of suppression of out-of-band emissions using a band stop filter that is of lower order than a band stop filter that achieves the specified level of suppression of out-of-band emission when no zeros are inserted to the signal. In some embodiments, each band stop filter includes an infinite impulse response, IIR, band stop filter electrically in series with a phase equalizer. In some embodiments, transfer function poles and transfer function zeros of both the IIR band stop filter and the phase equalizer are combined to provide a phase linear IIR filter. In some embodiments, the phase equalizer is an all pass phase equalizer. In some embodiments, the all pass phase equalizer is configured as a sum of two all pass filters using a Hilbert transform. In some embodiments, each band stop filter includes an infinite impulse response, IIR, band stop filter implemented using zero-phase IIR filtering, thereby doubling the filter order and providing zero phase distortion. In some embodiments, each band stop filter includes a cascade of band stop filters. In some embodiments, each band stop filter is an infinite impulse response, IIR, filter having quantized poles inside a unit circle centered at the origin of a complex plane. In some embodiments, each band stop filter is a finite impulse response, FIR, filter. In some embodiments, each band stop filter is a finite impulse response, FIR, filter, implemented in the frequency domain using a cascade of a Fast Fourier Transform, FFT, and an inverse FFT, following one of an overlap and save method and an overlap and add method. In some embodiments, portions of the signal output by the time domain beamformer in a vicinity of time domain beam weight transitions are filtered to improve the signal Error Vector Magnitude (EVM).

According to another aspect, a network node is configured to communicate with a wireless device. The network node is configured to implement a time domain beamformer, and includes circuitry configured to filter each signal output by the time domain beamformer by a band stop filter, the band stop filter including a stop band overlapping a pass band of the signal output by the time domain beamformer. The network node also includes circuitry configured to filter each signal output the time domain beamformer by a group delay filter in electrical parallel with a band stop filter, the group delay filter providing a group delay to the signal output by the time domain beamformer. The network node further includes circuitry to subtract an output of each band stop filter from an output of a corresponding group delay filter.

According to this aspect, in some embodiments, the circuitry is further configured to insert zeros to a signal that is processed to be input to the time domain beamformer to achieve a specified level of suppression of out-of-band emissions using a band stop filter that is of lower order than a band stop filter that achieves the specified level of suppression of out-of-band emission when no zeros are inserted to the signal. In some embodiments, each band stop filter includes an infinite impulse response, IIR, band stop filter in electrical series with a phase equalizer. In some embodiments, transfer function poles and transfer function zeros of both the IIR band stop filter and the phase equalizer are combined to provide a phase linear IIR filter. In some embodiments, the phase equalizer is an all pass phase equalizer. In some embodiments, the all pass phase equalizer is configured as a sum of two all pass filters using a Hilbert transform. In some embodiments, each band stop filter includes a cascade of band stop filters. In some embodiments, each band stop filter is an infinite impulse response, IIR, filter having quantized poles inside a unit circle centered at the origin of a complex plane. In some embodiments, each band stop filter is a finite impulse response, FIR, filter. In some embodiments, each stop band filter is a finite impulse response, FIR, filter, implemented in the frequency domain using a cascade of a Fast Fourier Transform, FFT, and an inverse FFT.

According to another aspect, a network node is configured to communicate with a wireless device. The network node includes: a time domain beamformer configured to beamform a plurality of signals to produce a plurality of time domain beamformer output signals; a plurality of band stop filters, each band stop filter of the plurality of band stop filter being configured to receive an output signal of the time domain beamformer; a plurality of group delay filters, each group delay filter of the plurality of group delay filters receiving an output signal of the time domain beamformer and being in electrical parallel with a band stop filter of the plurality of band stop filters; and a plurality of summation circuits, each summation circuit configured to subtract an output of a band stop filter of the plurality of band stop filters from an output of a corresponding group delay filter of the plurality of group delay filters.

According to this aspect, in some embodiments, the network node also includes circuitry to insert zeros to a signal that is processed to be input to the time domain beamformer to produce an output of the summation circuits that achieves a specified level of suppression of out-of-band emissions using a band stop filter that is of lower order than a band stop filter that achieves the specified level of suppression of out-of-band emission when no zeros are inserted to the signal. In some embodiments, each band stop filter of the plurality of band stop filters includes an infinite impulse response, IIR, band stop filter in electrical series with an all pass phase equalizer. In some embodiments, a stop band of a band stop filter of the plurality of band stop filters is configured to encompass a pass band of a time domain beamformer output signal that is input to the band stop filter.

According to yet another aspect, a method in a network node configured to communicate with a wireless device is provided. The method includes: beamforming a plurality of signals to produce a plurality of time domain beamformer output signals; filtering each signal of the plurality of signals by a band stop filter, each band stop filter being configured to receive an output signal of the time domain beamformer; group delay-filtering each signal of the plurality of signals by a of group delay filter, each group delay filter being configured to receive an output signal of the time domain beamformer and being in electrical parallel with a band stop filter; and for each band stop filter, subtracting an output of a band stop filter from an output of a corresponding group delay filter.

According to this aspect, in some embodiments, the method also includes inserting zeros to a signal that is processed to be input to the time domain beamformer to produce an output of the subtracting that achieves a specified level of suppression of out-of-band emissions using a band stop filter that is of lower order than a band stop filter that achieves the specified level of suppression of out-of-band emission when no zeros are inserted to the signal. In some embodiments, each band stop filter includes an infinite impulse response, IIR, band stop filter in electrical series with an all pass phase equalizer. In some embodiments, a stop band of a band stop filter is configured to encompass a pass band of a time domain beamformer output signal that is input to the band stop filter.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein.

DETAILED DESCRIPTION

Figure 1:
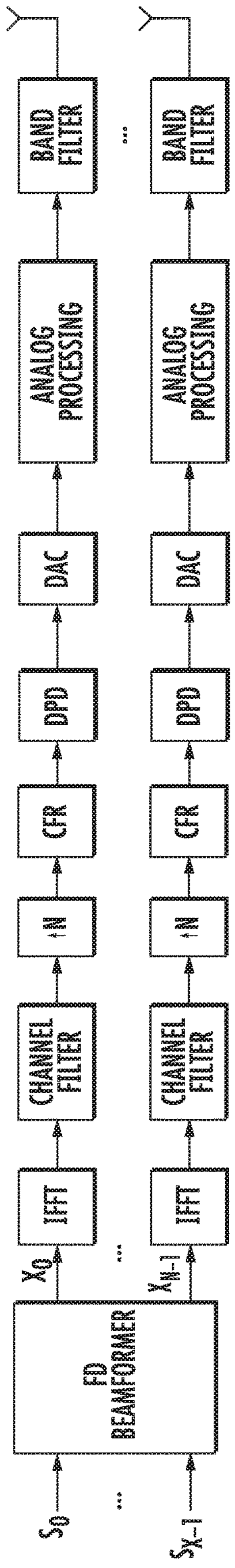
FIG. 1 is a first example of a known transmit processing chain.

Before describing in detail example embodiments, it is noted that the embodiments reside primarily in combinations of apparatus components and processing steps related to forward distortion correction (FDC) for time-domain beamforming. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

In embodiments described herein, the joining term, "in communication with" and the like, may be used to indicate electrical or data communication, which may be accomplished by physical contact, induction, electromagnetic radiation, radio signaling, infrared signaling or optical signaling, for example. One having ordinary skill in the art will appreciate that multiple components may interoperate and modifications and variations are possible of achieving the electrical and data communication.

In some embodiments described herein, the term "coupled," "connected," and the like, may be used herein to indicate a connection, although not necessarily directly, and may include wired and/or wireless connections.

The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

The term "network node" used herein can be any kind of network node comprised in a radio network which may further comprise any of base station (BS), radio base station, base transceiver station (BTS), base station controller (BSC), radio network controller (RNC), g Node B (gNB), evolved Node B (eNB or eNodeB), Node B, multi-standard radio (MSR) radio node such as MSR BS, multi-cell/ multicast coordination entity (MCE), relay node, donor node controlling relay, radio access point (AP), transmission points, transmission nodes, Remote Radio Unit (RRU) Remote Radio Head (RRH), a core network node (e.g., mobile management entity (MME), self-organizing network (SON) node, a coordinating node, positioning node, MDT node, etc.), an external node (e.g., 3rd party node, a node external to the current network), nodes in distributed antenna system (DAS), a spectrum access system (SAS) node, an element management system (EMS), etc. The network node may also comprise test equipment. The term "radio node" used herein may be used to also denote a wireless device (WD) such as a wireless device (WD) or a radio network node.

In some embodiments, the non-limiting terms wireless device (WD) or a user equipment (UE) are used interchangeably. The WD herein can be any type of wireless device capable of communicating with a network node or another WD over radio signals, such as wireless device (WD). The WD may also be a radio communication device, target device, device to device (D2D) WD, machine type WD or WD capable of machine to machine communication (M2M), low-cost and/or low-complexity WD, a sensor equipped with WD, Tablet, mobile terminals, smart phone, laptop embedded equipped (LEE), laptop mounted equipment (LME), USB dongles, Customer Premises Equipment (CPE), an Internet of Things (IoT) device, or a Narrowband IoT (NB-IOT) device etc.

Also, in some embodiments the generic term "radio network node" is used. It can be any kind of a radio network node which may comprise any of base station, radio base station, base transceiver station, base station controller, network controller, RNC, evolved Node B (eNB), Node B, gNB, Multi-cell/multicast Coordination Entity (MCE), relay node, access point, radio access point, Remote Radio Unit (RRU) Remote Radio Head (RRH).

Note that although terminology from one particular wireless system, such as, for example, 3GPP LTE and/or New Radio (NR), may be used in this disclosure, this should not be seen as limiting the scope of the disclosure to only the aforementioned system. Other wireless systems, including without limitation Wide Band Code Division Multiple Access (WCDMA), Worldwide Interoperability for Microwave Access (WiMax), Ultra Mobile Broadband (UMB) and Global System for Mobile Communications (GSM), may also benefit from exploiting the ideas covered within this disclosure.

Note further, that functions described herein as being performed by a wireless device or a network node may be distributed over a plurality of wireless devices and/or network nodes. In other words, it is contemplated that the functions of the network node and wireless device described herein are not limited to performance by a single physical device and, in fact, can be distributed among several physical devices.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 7:
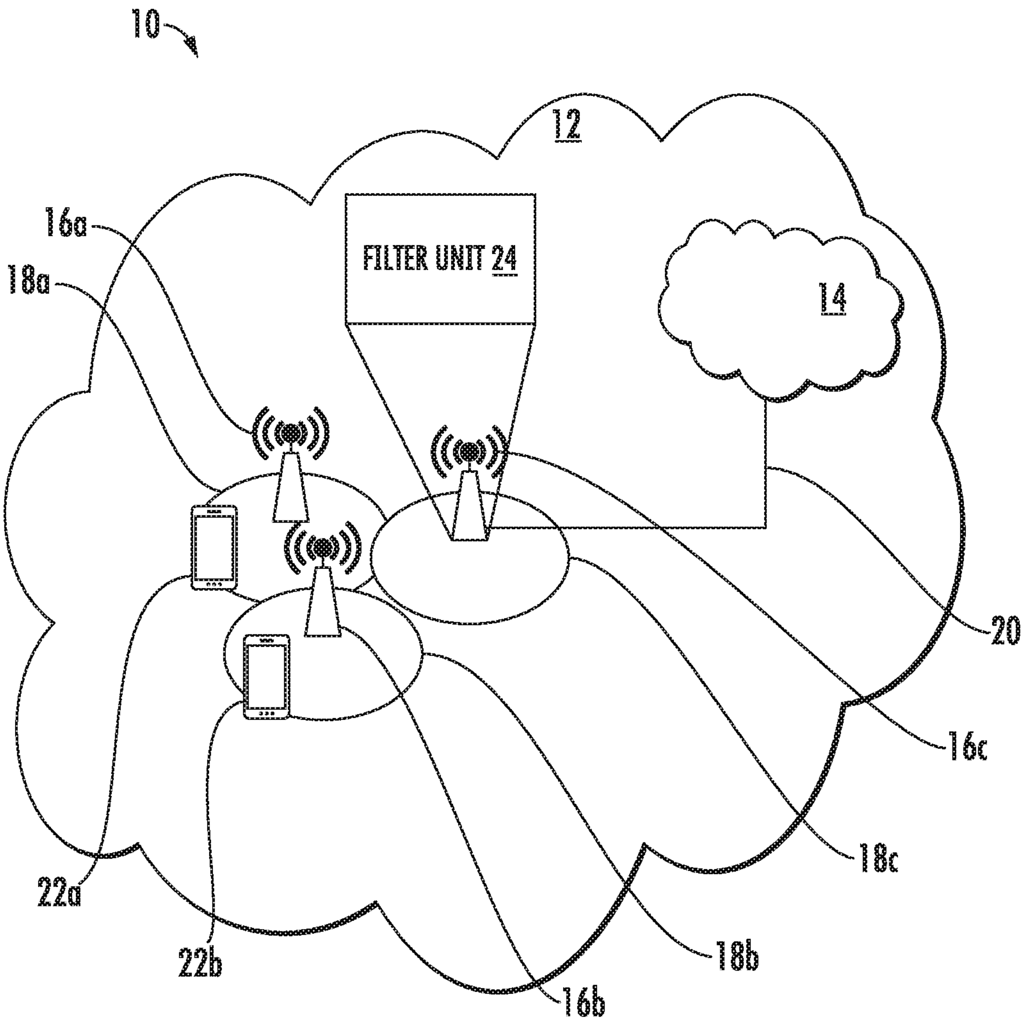
FIG. 7 is a schematic diagram of an example network architecture illustrating a communication system according to principles disclosed herein.

Referring again to the drawing figures, in which like elements are referred to by like reference numerals, there is shown in FIG. 7 a schematic diagram of a communication system 10, according to an embodiment, such as a 3GPP-type cellular network that may support standards such as LTE and/or NR (5G), which comprises an access network 12, such as a radio access network, and a core network 14. The access network 12 comprises a plurality of network nodes 16*a*, 16*b*, 16*c* (referred to collectively as network nodes 16), such as NBs, eNBs, gNBs or other types of wireless access points, each defining a corresponding coverage area 18*a*, 18*b*, 18*c* (referred to collectively as coverage areas 18). Each network node 16*a*, 16*b*, 16*c* is connectable to the core network 14 over a wired or wireless connection 20. A first wireless device (WD) 22*a* located in coverage area 18*a* is configured to wirelessly connect to, or be paged by, the corresponding network node 16*a*. A second WD 22*b* in coverage area 18*b* is wirelessly connectable to the corresponding network node 16*b*. While a plurality of WDs 22*a*, 22*b* (collectively referred to as wireless devices 22) are illustrated in this example, the disclosed embodiments are equally applicable to a situation where a sole WD is in the coverage area or where a sole WD is connecting to the corresponding network node 16. Note that although only two WDs 22 and three network nodes 16 are shown for convenience, the communication system may include many more WDs 22 and network nodes 16.

Also, it is contemplated that a WD 22 can be in simultaneous communication and/or configured to separately communicate with more than one network node 16 and more than one type of network node 16. For example, a WD 22 can have dual connectivity with a network node 16 that supports LTE and the same or a different network node 16 that supports NR. As an example, WD 22 can be in communication with an eNB for LTE/E-UTRAN and a gNB for NR/NG-RAN.

A network node 16 (eNB or gNB) is configured to include a NN filter unit 24 which is configured to filter each signal output by a time domain beamformer by a group delay filter in electrical parallel with a band stop filter, the group delay filter providing a group delay to the signal output by the time domain beamformer.

Example implementations, in accordance with an embodiment, of the WD 22 and network node 16 discussed in the preceding paragraphs will now be described with reference to FIG. 8.

The communication system 10 includes a network node 16 provided in a communication system 10 and including hardware 28 enabling it to communicate with the WD 22. The hardware 28 may include a radio interface 30 for setting up and maintaining at least a wireless connection 32 with a WD 22 located in a coverage area 18 served by the network node 16. The radio interface 30 may be formed as or may include, for example, one or more RF transmitters, one or more RF receivers, and/or one or more RF transceivers. The radio interface 30 includes an array of antennas 34 to radiate and receive signal(s) carrying electromagnetic waves and also includes the network node filter unit 24.

In the embodiment shown, the hardware 28 of the network node 16 further includes processing circuitry 36. The processing circuitry 36 may include a processor 38 and a memory 40. In particular, in addition to or instead of a processor, such as a central processing unit, and memory, the processing circuitry 36 may comprise integrated circuitry for processing and/or control, e.g., one or more processors and/or processor cores and/or FPGAs (Field Programmable Gate Array) and/or ASICs (Application Specific Integrated Circuitry) adapted to execute instructions. The processor 38 may be configured to access (e.g., write to and/or read from) the memory 40, which may comprise any kind of volatile and/or nonvolatile memory, e.g., cache and/or buffer memory and/or RAM (Random Access Memory) and/or ROM (Read-Only Memory) and/or optical memory and/or EPROM (Erasable Programmable Read-Only Memory).

Thus, the network node 16 further has software 42 stored internally in, for example, memory 40, or stored in external memory (e.g., database, storage array, network storage device, etc.) accessible by the network node 16 via an external connection. The software 42 may be executable by the processing circuitry 36. The processing circuitry 36 may be configured to control any of the methods and/or processes described herein and/or to cause such methods, and/or processes to be performed, e.g., by network node 16. Processor 38 corresponds to one or more processors 38 for performing network node 16 functions described herein. The memory 40 is configured to store data, programmatic software code and/or other information described herein. In some embodiments, the software 42 may include instructions that, when executed by the processor 38 and/or processing circuitry 36, causes the processor 38 and/or processing circuitry 36 to perform the processes described herein with respect to network node 16. For example, processing circuitry 36 of the network node 16 may include a NN filter unit 24 which is configured to filter each signal output by a time domain beamformer by a group delay filter in electrical parallel with a band stop filter, the group delay filter providing a group delay to the signal output by the time domain beamformer.

The communication system 10 further includes the WD 22 already referred to. The WD 22 may have hardware 44 that may include a radio interface 46 configured to set up and maintain a wireless connection 32 with a network node 16 serving a coverage area 18 in which the WD 22 is currently located. The radio interface 46 may be formed as or may include, for example, one or more RF transmitters, one or more RF receivers, and/or one or more RF transceivers. The radio interface 46 includes an array of antennas 48 to radiate and receive signal(s) carrying electromagnetic waves, and also include the WD filter unit 26.

The hardware 44 of the WD 22 further includes processing circuitry 50. The processing circuitry 50 may include a processor 52 and memory 54. In particular, in addition to or instead of a processor, such as a central processing unit, and memory, the processing circuitry 50 may comprise integrated circuitry for processing and/or control, e.g., one or more processors and/or processor cores and/or FPGAs (Field Programmable Gate Array) and/or ASICs (Application Specific Integrated Circuitry) adapted to execute instructions. The processor 52 may be configured to access (e.g., write to and/or read from) memory 54, which may comprise any kind of volatile and/or nonvolatile memory, e.g., cache and/or buffer memory and/or RAM (Random Access Memory) and/or ROM (Read-Only Memory) and/or optical memory and/or EPROM (Erasable Programmable Read-Only Memory).

Thus, the WD 22 may further comprise software 56, which is stored in, for example, memory 54 at the WD 22, or stored in external memory (e.g., database, storage array, network storage device, etc.) accessible by the WD 22. The software 56 may be executable by the processing circuitry 50. The software 56 may include a client application 58. The client application 58 may be operable to provide a service to a human or non-human user via the WD 22.

The processing circuitry 50 may be configured to control any of the methods and/or processes described herein and/or to cause such methods, and/or processes to be performed, e.g., by WD 22. The processor 52 corresponds to one or more processors 52 for performing WD 22 functions described herein. The WD 22 includes memory 54 that is configured to store data, programmatic software code and/or other information described herein. In some embodiments, the software 56 and/or the client application 58 may include instructions that, when executed by the processor 52 and/or processing circuitry 50, causes the processor 52 and/or processing circuitry 50 to perform the processes described herein with respect to WD 22.

Figure 8:
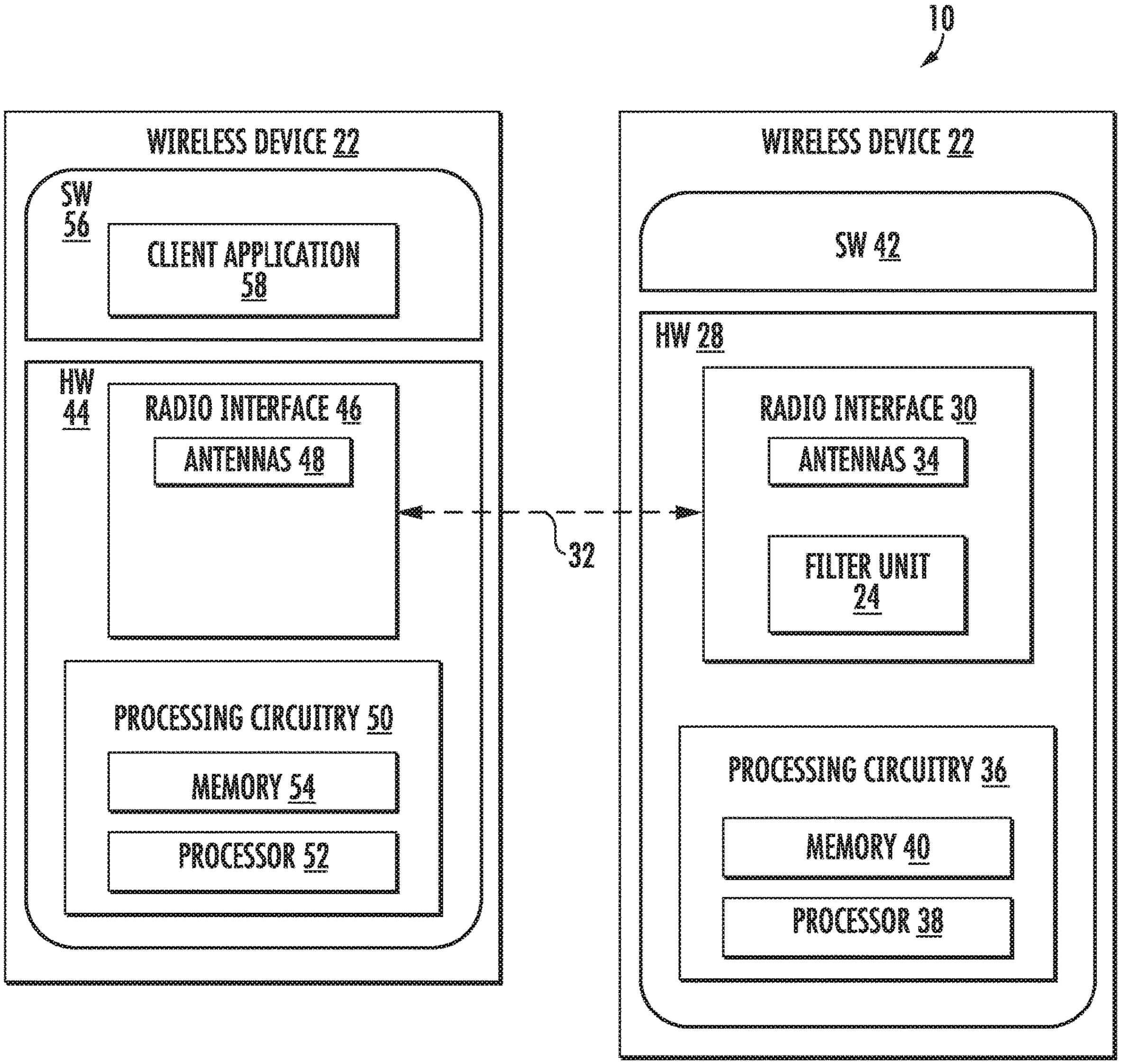
FIG. 8 is a block diagram of a network node in communication with a wireless device over a wireless connection according to some embodiments of the present disclosure.

In some embodiments, the inner workings of the network node 16 and WD 22 may be as shown in FIG. 8 and independently, the surrounding network topology may be that of FIG. 7.

The wireless connection 32 between the WD 22 and the network node 16 is in accordance with the teachings of the embodiments described throughout this disclosure. More precisely, the teachings of some of these embodiments may improve the data rate, latency, and/or power consumption and thereby provide benefits such as reduced user waiting time, relaxed restriction on file size, better responsiveness, extended battery lifetime, etc. In some embodiments, a measurement procedure may be provided for the purpose of monitoring data rate, latency and other factors on which the one or more embodiments improve.

Although FIGS. 7 and 8 show various "units" such as filter unit 24 as being within a respective processor, it is contemplated that these units may be implemented such that a portion of the unit is stored in a corresponding memory within the processing circuitry. In other words, the units may be implemented in hardware or in a combination of hardware and software within the processing circuitry.

Figure 9:
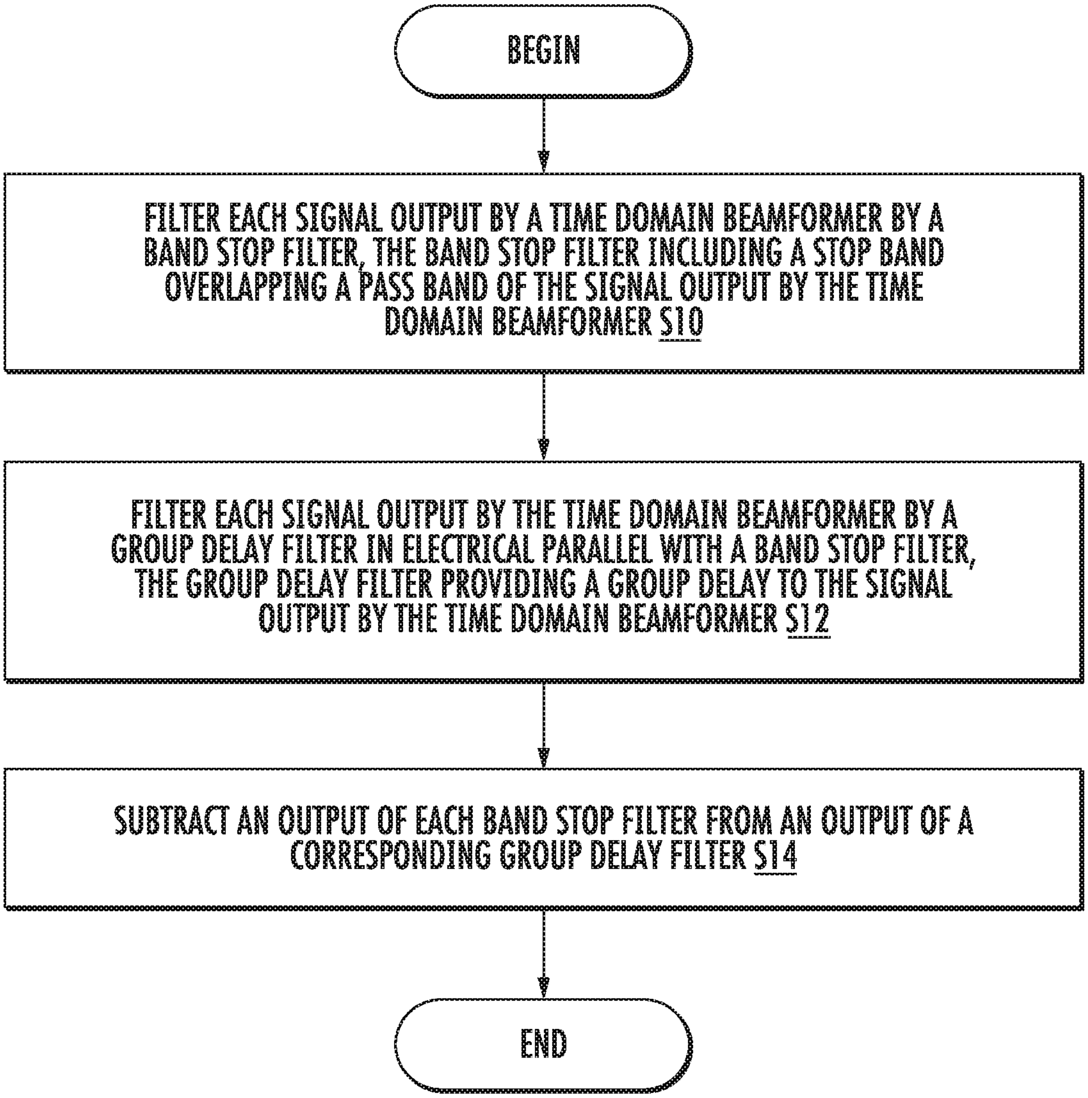
FIG. 9 is a flowchart of an example process in a network node for forward distortion correction (FDC) for time-domain beamforming according to some embodiments of the present disclosure.

FIG. 9 is a flowchart of an example process in a network node 16 for forward distortion correction for time-domain beamforming. One or more blocks described herein may be performed by one or more elements of network node 16 such as by one or more of processing circuitry 36 (including the filter unit 24), processor 38, and/or radio interface 30. Network node 16 such as via processing circuitry 36 and/or processor 38 and/or radio interface 30 is configured to filter each signal output by a time domain beamformer by a band stop filter, the band stop filter including a stop band overlapping a pass band of the signal output by the time domain beamformer (Block S10). The process also includes filtering each signal output by the time domain beamformer by a group delay filter in electrical parallel with a band stop filter, the group delay filter providing a group delay to the signal output by the time domain beamformer (Block S12). The process further includes subtracting an output of each band stop filter from an output of a corresponding group delay filter (Block S14).

Figure 10:
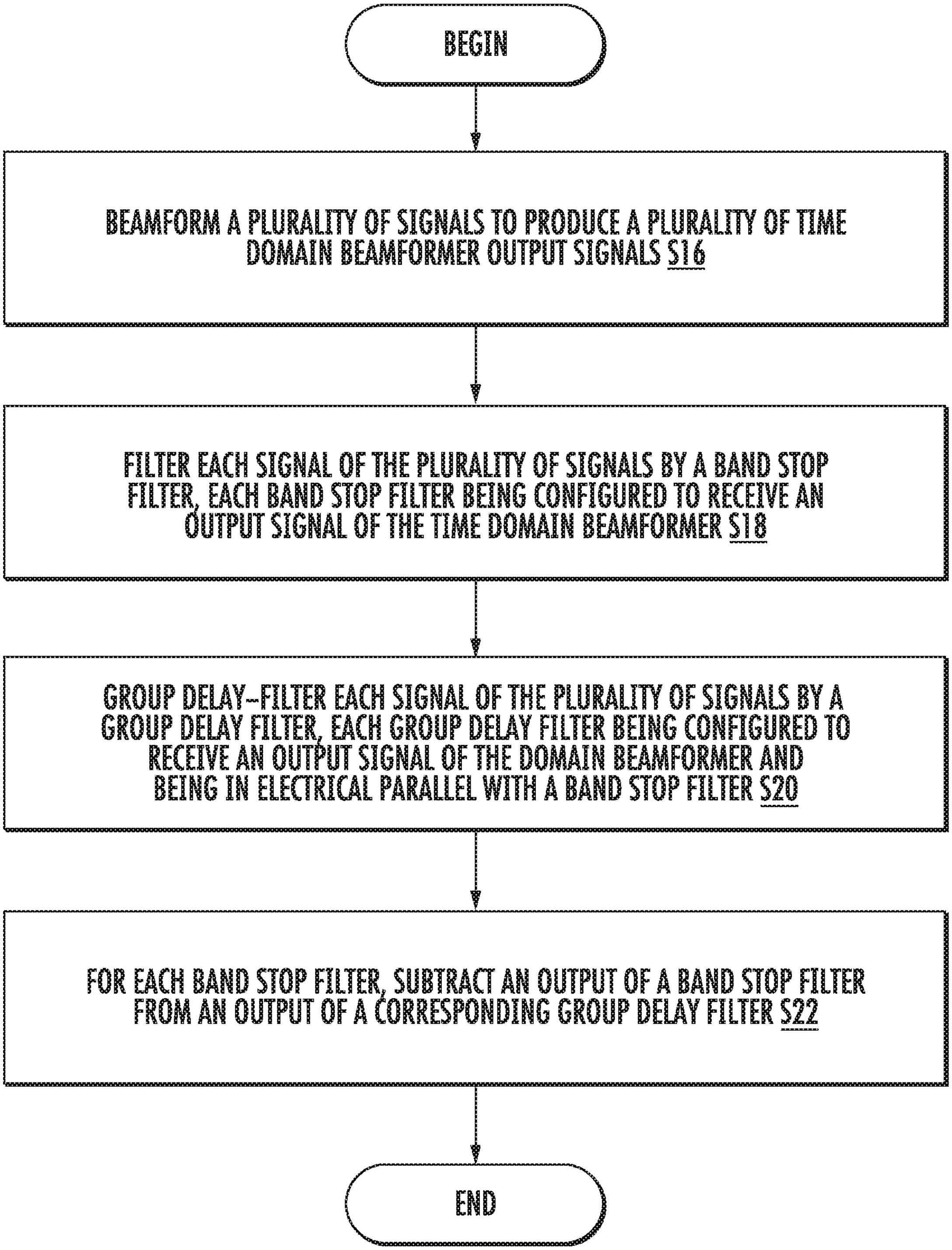
FIG. 10 is a flowchart of another example process in a network node according to some embodiments of the present disclosure.

FIG. 10 is a flowchart of another example process in a network node 16 according to some embodiments of the present disclosure. One or more blocks described herein may be performed by one or more elements of network node 16 such as by one or more of processing circuitry 36, processor 38, and/or radio interface 30 (including the filter unit 24). The network node 16 such as via processing circuitry 36 and/or processor 38 and/or radio interface 30 is configured to beamform a plurality of signals to produce a plurality of time domain beamformer output signals (Block S16). The process also includes filtering each signal of the plurality of signals by a band stop filter, each band stop filter being configured to receive an output signal of the time domain beamformer (Block S18). The process also includes group delay-filtering each signal of the plurality of signals by a of group delay filter, each group delay filter being configured to receive an output signal of the time domain beamformer and being in electrical parallel with a band stop filter (Block S20). The process also includes for each band stop filter, subtracting an output of a band stop filter from an output of a corresponding group delay filter (Block S22).

Having described the general process flow of arrangements of the disclosure and having provided examples of hardware and software arrangements for implementing the processes and functions of the disclosure, the sections below provide details and examples of arrangements for forward distortion correction for time-domain beamforming.

Figure 11:
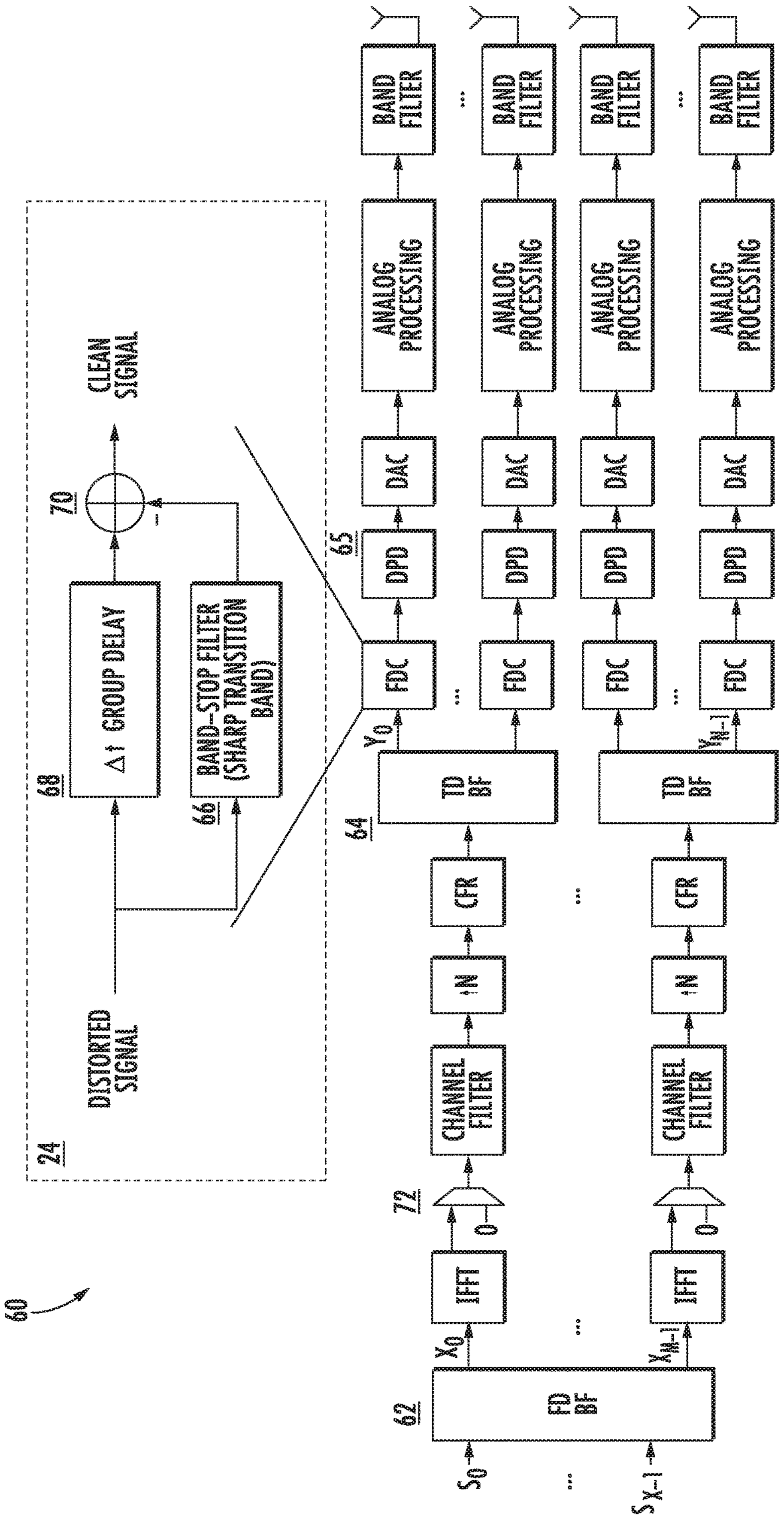
FIG. 11 is an architecture according to principles set forth herein.

Some embodiments for forward distortion correction (FDC) provide a digital distortion mitigation approach that can be used to limit the spectral regrowth caused by time-domain beamforming switching activity. Some digital filters with very sharp transition bands isolate the operating band unwanted emissions (OBUE), which is then subtracted from the distorted signal as shown in the example of FIG. 11. This processing may take place immediately after the time-domain beamformer.

Figure 2:
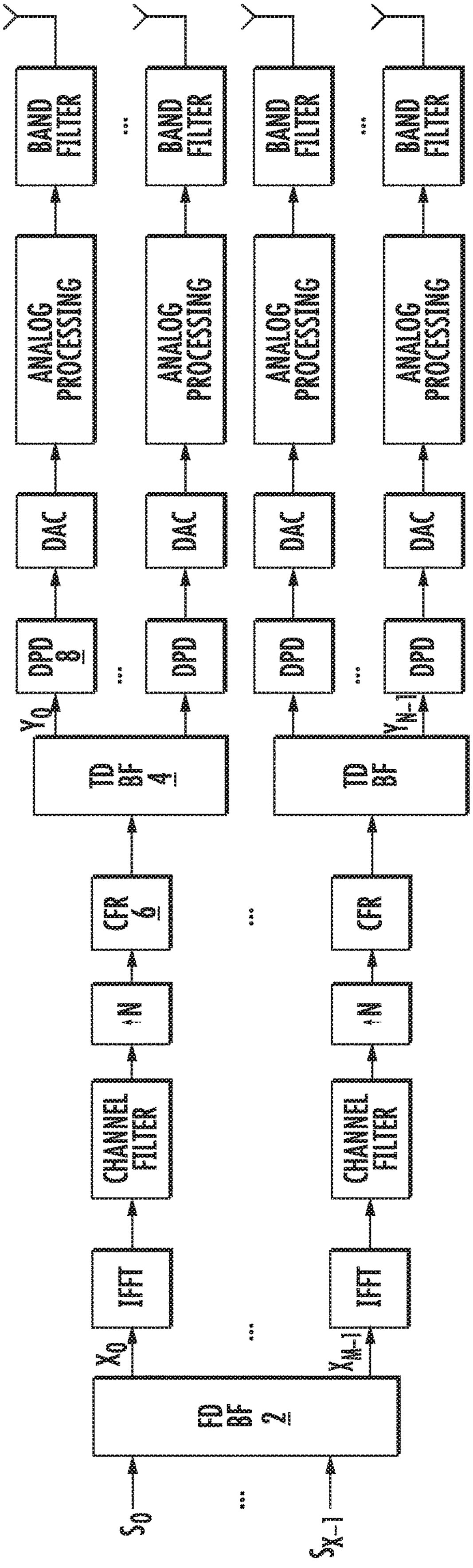
FIG. 2 is a second example of a known transmit processing chain.
Figure 3:
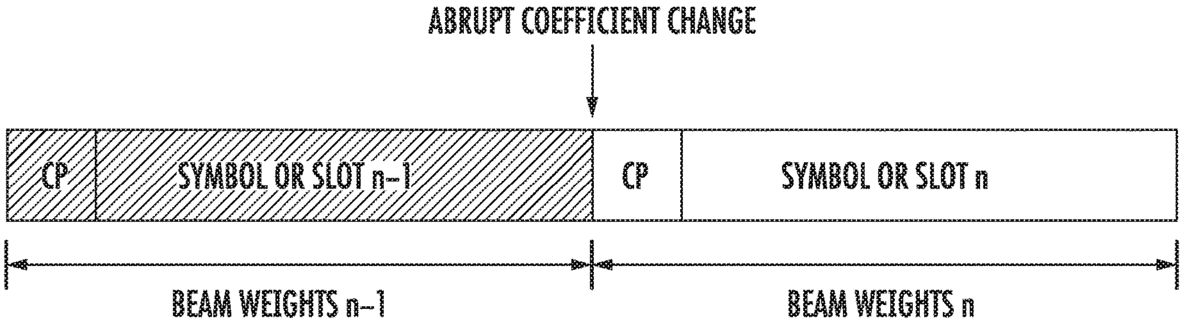
FIG. 3 illustrates timing of beam weight switching.
Figure 4:
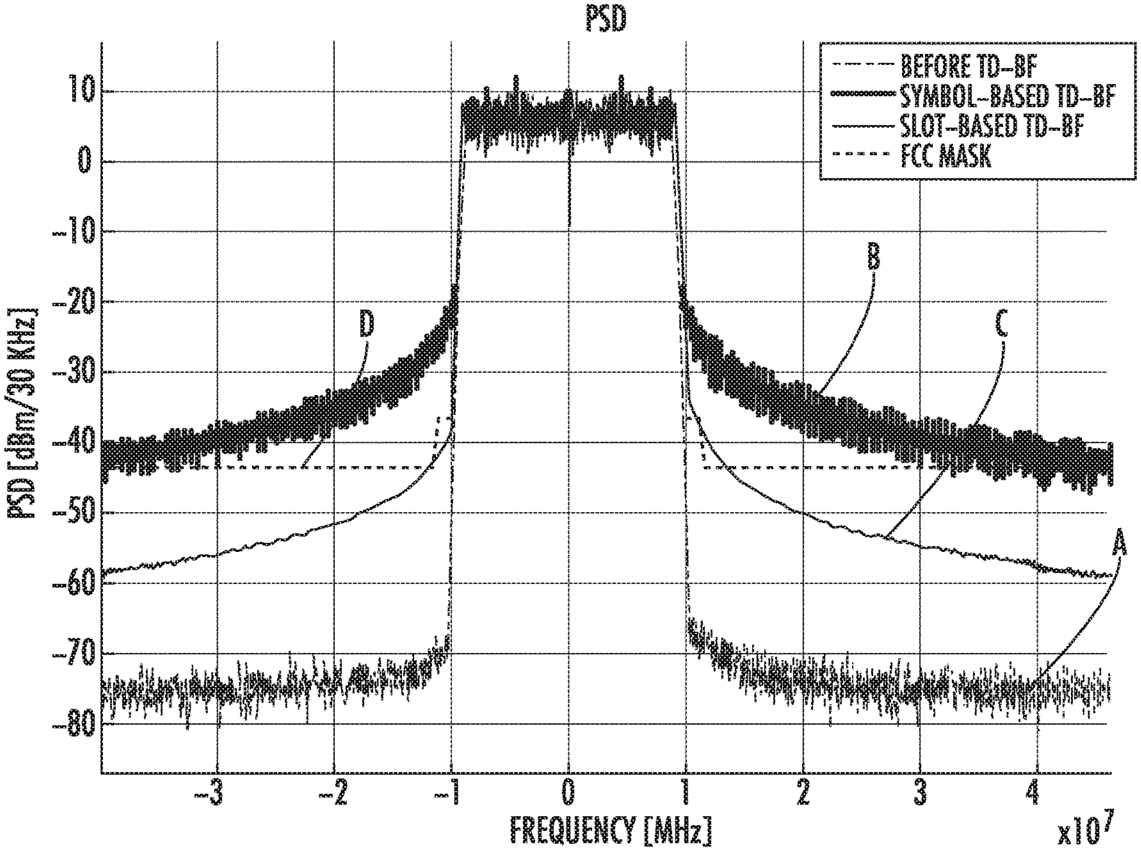
FIG. 4 illustrates spectral regrowth caused by beam weight switching.
Figure 5:
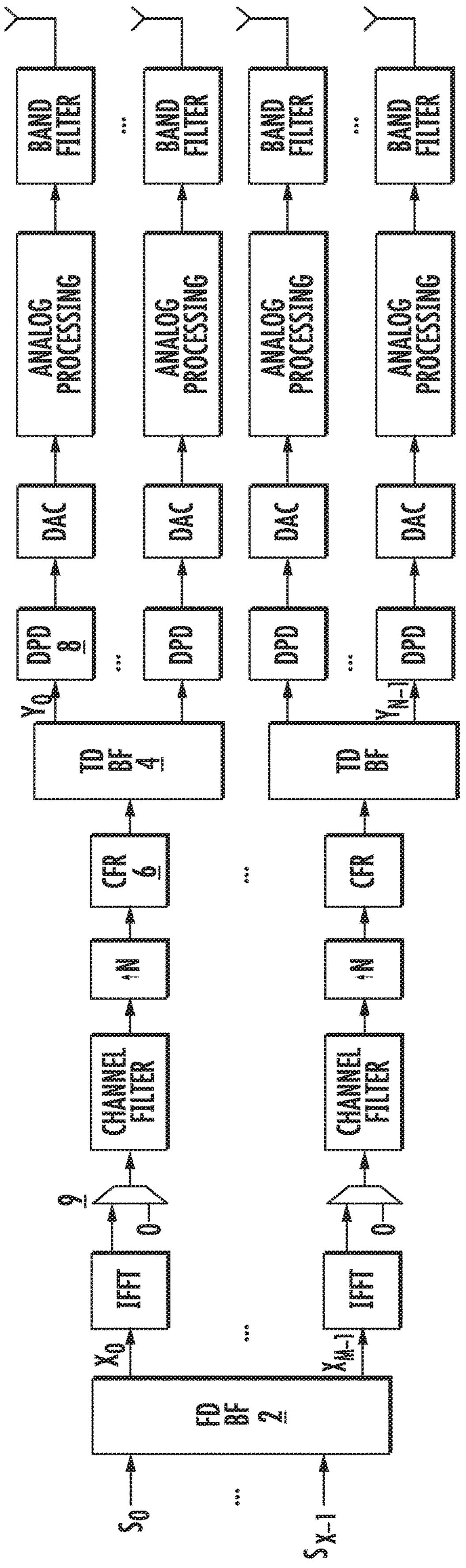
FIG. 5 is an architecture that include baseband zero insertion.
Figure 6:
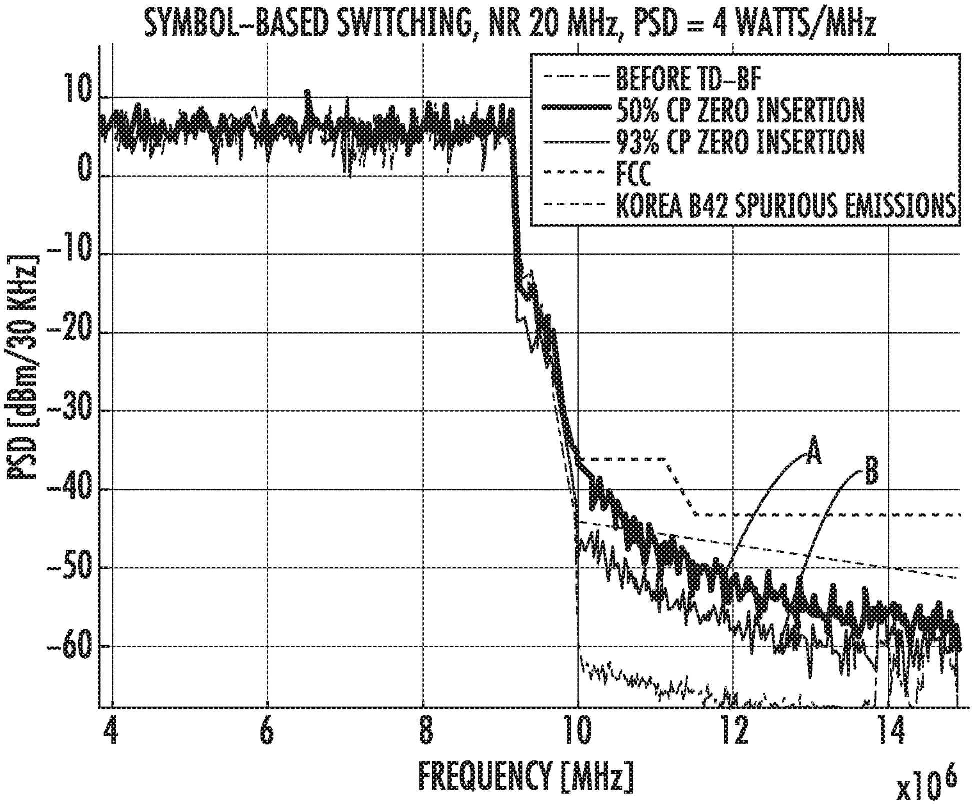
FIG. 6 illustrates a power spectral density (PSD) for different percentages of cyclic prefix zero insertions.

FIG. 11 shows an example schematic diagram of a plurality of parallel processing chains 60 for processing signals from a frequency domain digital beam former 62. The processing chain may be the same as the processing chain of FIG. 2 with the addition of the filter unit 24 after each time domain beamformer 64 and before the corresponding DPD 65. The filter unit 24 may include a band stop filter 66 in electrical parallel with a group delay filter 68. The band stop filter 66 may have a sharp transition band and a stop band overlapping a pass band of a signal output by the time domain beamformer 64. The group delay filter 68 may be configured to provide a group delay to the signal output by the time domain beamformer 64. The outputs of the band stop filter 66 and the group delay filter 68 may be subtracted by the summation circuit 70 to produce a signal that is at least partially compensated for switching spectra.

The FDC method described below eliminates or shortens the length of baseband zero insertion required to meet the OBUE requirement masks. This baseband zero insertion may be implemented by the circuitry 72, which may be a multiplexer such as a baseband zero insertion multiplexer. There is a trade-off between the link-level performance, filter complexity and the desired safety of margin with respect to the OBUE requirement masks. This tradeoff may be achieved by introduction of the band stop filter 66 which may be implemented as a Finite Impulse Response (FIR) filter or an Infinite Impulse Response (IIR) filter. The higher the order of the band stop filter 66, the lower the percentage of zeros to be input to the baseband zero insertion multiplexer circuitry 72 in order to meet mask requirements.

FIR filters have a stable behavior with predictable group delays. However, they require more filter taps to achieve the required steep transition bands at the potentially high-sampling rate in the time-domain. Long impulse response FIR filters can alternatively be implemented in the frequency domain with fewer multiplication operations using the well-known "overlap and save" or "overlap and add" methods. In these techniques, the signal is converted to the frequency domain by Fast-Fourier Transform (FFT) on a block-by-block basis. Each frequency domain signal block is then multiplied by the frequency domain FIR filter response, thus achieving a block-wise circular convolution between the signal and the filter response. The output from the block-wise circular convolution is then converted back to the time domain using an Inverse Fast Fourier Transform (IFFT) operation. Proper overlapping may be provided between the consecutive block-wise circular convolution outputs in order to generate the full convolution. The reduced number of multiplications in the overlap and save and the overlap and add methods is done at the expense of an increased latency and a reduced signal to quantization noise ratio (SQNR) due to the FFT and IFFT operations.

The IIR filters can achieve sharp transition bands with much lower filter order. However, IIR filters can be unstable if not properly designed. The IIR stability issue can be addressed by ensuring that the (quantized) filter poles are located inside the unit circle centered at the origin of a complex plane.

The IIR group delay may also widely vary over frequency, especially around the transition band. This can be fixed by cascading an all-pass phase equalizer 74 in electrical series with the band stop filter 66, as illustrated in the example of FIG. 12.

Figure 13:
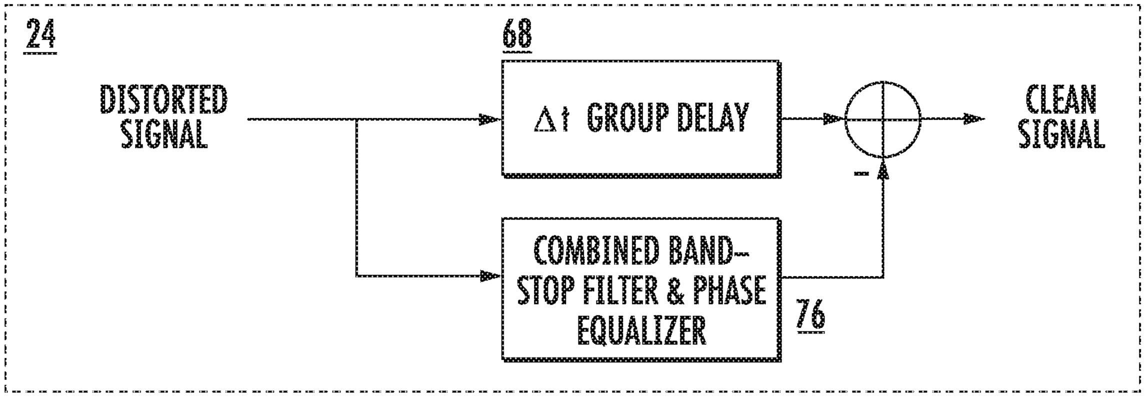
FIG. 13 is another example of a filter unit according to principles set forth herein.

In some embodiments, all-pass phase equalizers 74 may be designed following known algorithms. In accordance with other embodiments, all-pass phase equalizers 74 can be implemented as the sum of two all-pass filters using a Hilbert transform. A benefit of this approach is reduced coefficient quantization sensitivity. Since the all-pass phase equalizer 74 may also be implemented as an IIR filter, the poles and the zeros from both the band stop filter 66 and the all-pass phase equalizer 74 may be combined into a single impulse response filter 76, thereby yielding the architecture illustrated in the example diagram of FIG. 13. Another benefit of IIR filters is that they can be used to implement multiband filters, which is useful for handling signals containing multiple carrier components.

Figure 12:
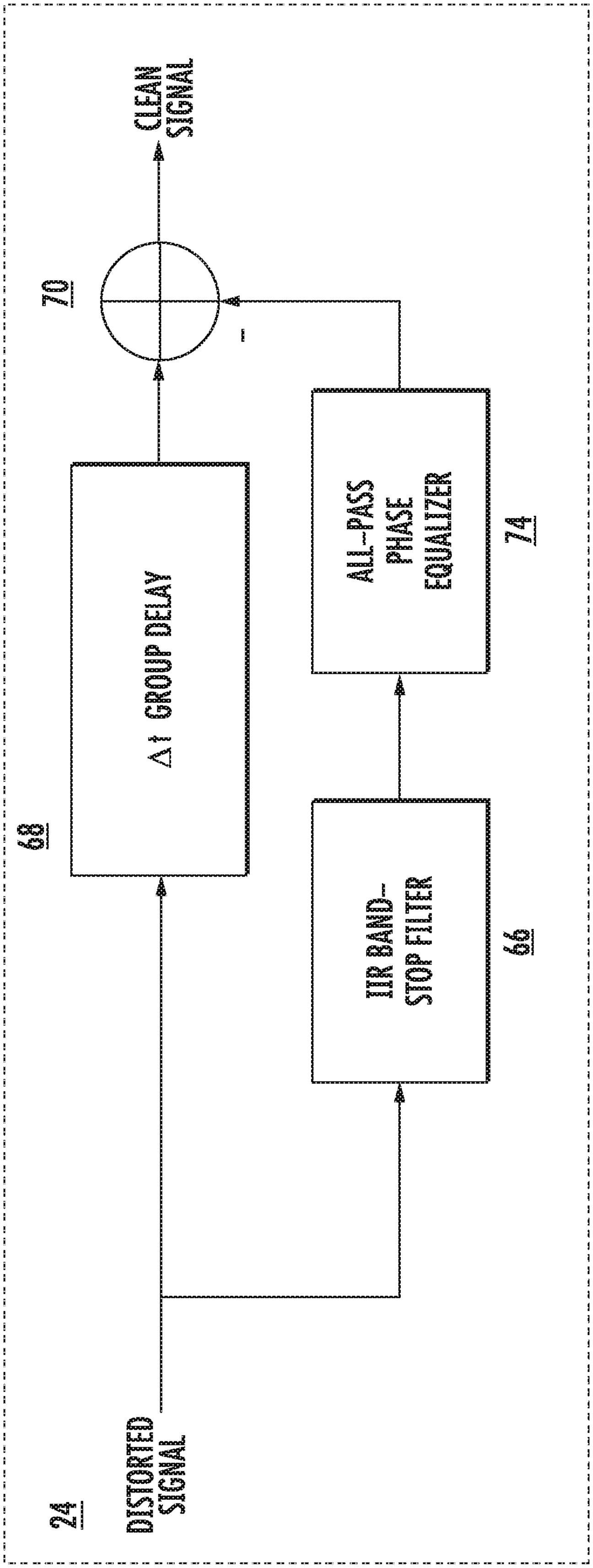
FIG. 12 is an example of a filter unit according to principles set forth herein.

In some embodiments, the IIR band stop filter 66 of FIG. 12 is implemented using zero-phase IIR filtering, by first processing the signal through the filter in the forward direction, and then in the reverse direction. This effectively doubles the filter order but eliminates the need for the all-pass phase equalizer 74 as the signal does not have any phase distortion. Zero-phase IIR filtering can be performed on streaming data at the cost of increased latency using the overlap and save or the overlap and add method.

In some embodiments, limited signal portions are filtered around the time domain beamforming weight transitions instead of filtering the entire data stream to improve the signal Error Vector Magnitude (EVM).

Figure 14:
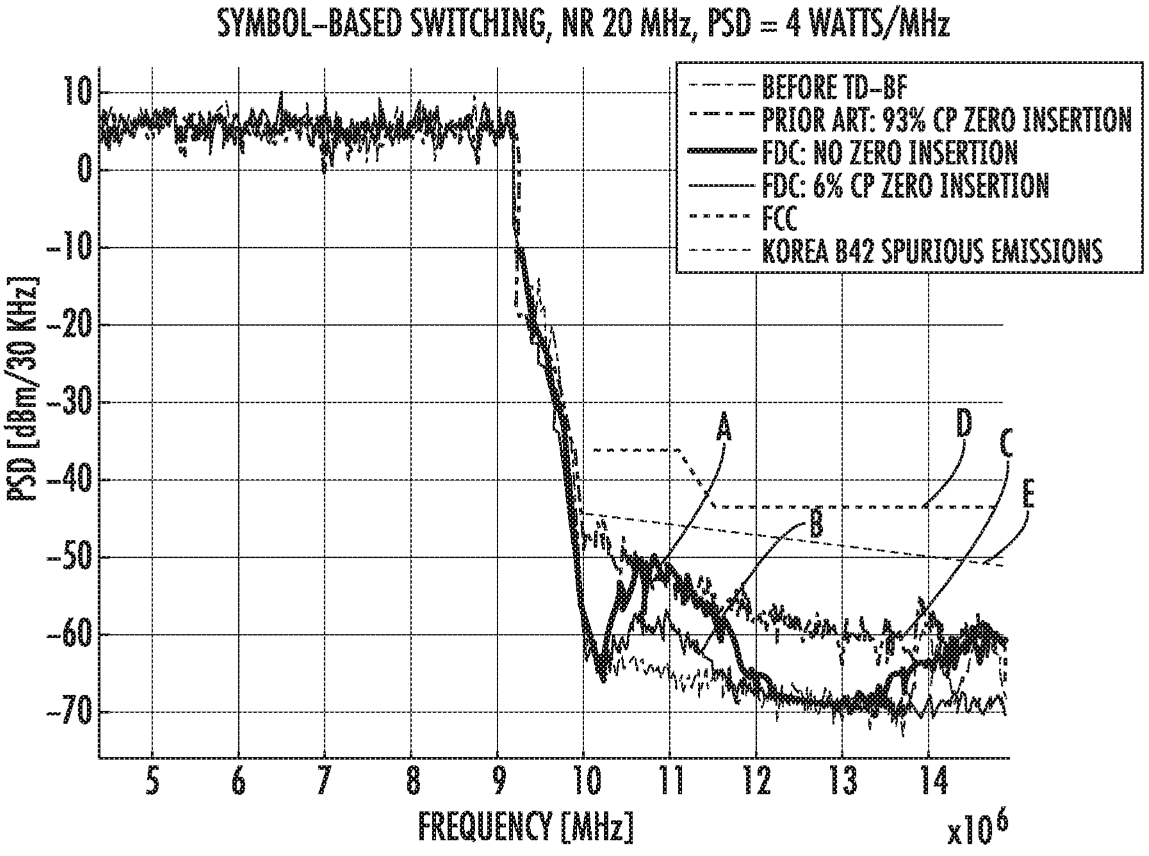
FIG. 14 illustrates a PSD with FDC according to principles set forth herein.

FIG. 14 shows an example of the spectrum of a NR 20 MHz carrier after the filter unit 24, using a cascade of two 6th order elliptic IIR filters using zero-phase IIR filtering to form the band stop filter 66. In FIG. 14, the trace A is an example of the FDC spectrum without baseband zero insertion. Both requirement masks are met with good margin. However, a small bump appears at around 10.8 MHz. This can be fixed by either slightly increasing the IIR filter order or by using a short baseband zero insertion window. Trace B shows the FDC spectrum when zeroing 6% of the cyclic prefix. In this case, both requirement masks are met with some healthy margins. For comparison, the trace C displays the spectrum of the prior art using a baseband zero insertion length corresponding to 93% of the cyclic prefix. Lines D and E are the FCC and Korea mask requirements, respectively.

The methods described herein may be implemented in edge computing or in the cloud. The methods described herein may also apply to ORAN radios.

According to one aspect, a method in a network node 16 configured to communicate with a wireless device 22 is provided. The method includes filtering each signal output by a time domain beamformer 64 by a band stop filter 66, the band stop filter 66 including a stop band overlapping a pass band of the signal output by the time domain beamformer

64. The method also includes filtering each signal output by the time domain beamformer 64 by a group delay filter 68 in electrical parallel with a band stop filter 66, the group delay filter 68 providing a group delay to the signal output by the time domain beamformer 64. The method further includes subtracting an output of each band stop filter 66 from an output of a corresponding group delay filter 68.

According to this aspect, in some embodiments, the method further includes inserting zeros to a signal that is processed to be input to the time domain beamformer 64 to achieve a specified level of suppression of out-of-band emissions using a band stop filter 66 that is of lower order than a band stop filter 66 that achieves the specified level of suppression of out-of-band emission when no zeros are inserted to the signal. In some embodiments, each band stop filter 66 includes an infinite impulse response, IIR, band stop filter 66 electrically in series with a phase equalizer 74. In some embodiments, transfer function poles and transfer function zeros of both the IIR band stop filter 66 and the phase equalizer 74 are combined to provide a phase linear IIR filter. In some embodiments, the phase equalizer 74 is an all pass phase equalizer 74. In some embodiments, the all pass phase equalizer 74 is configured as a sum of two all pass filters using a Hilbert transform. In some embodiments, each band stop filter 66 includes an infinite impulse response, IIR, band stop filter 66 implemented using zero-phase IIR filtering, thereby doubling the filter order and providing zero phase distortion. In some embodiments, each band stop filter 66 includes a cascade of band stop filters. In some embodiments, each band stop filter 66 is an infinite impulse response, IIR, filter having quantized poles inside a unit circle centered at the origin of a complex plane. In some embodiments, each band stop filter 66 is a finite impulse response, FIR, filter. In some embodiments, each band stop filter 66 is a finite impulse response, FIR, filter, implemented in the frequency domain using a cascade of a Fast Fourier Transform, FFT, and an inverse FFT, following one of an overlap and save method and an overlap and add method. In some embodiments, portions of the signal output by the time domain beamformer 64 in a vicinity of time domain beam weight transitions are filtered to improve the signal Error Vector Magnitude (EVM).

According to another aspect, a network node 16 is configured to communicate with a wireless device 22. The network node 16 is configured to implement a time domain beamformer 64, and includes filter unit 24 configured to filter each signal output by the time domain beamformer 64 by a band stop filter 66, the band stop filter 66 including a stop band overlapping a pass band of the signal output by the time domain beamformer 64. Filter unit 24 is also configured to filter each signal output the time domain beamformer 64 by a group delay filter 68 in electrical parallel with the band stop filter 66, the group delay filter 68 providing a group delay to the signal output by the time domain beamformer 64. Filter unit 24 also include summation circuit 70 configured to subtract an output of each band stop filter 66 from an output of a corresponding group delay filter 68.

According to this aspect, in some embodiments, circuitry 72, e.g., baseband zero insertion multiplexer, is configured to insert zeros to a signal that is processed to be input to the time domain beamformer 64 to achieve a specified level of suppression of out-of-band emissions using a band stop filter 66 that is of lower order than a band stop filter that achieves the specified level of suppression of out-of-band emission when no zeros are inserted to the signal. In some embodiments, each band stop filter 66 includes an infinite impulse response, IIR, band stop filter 66 in electrical series with a phase equalizer 74. In some embodiments, transfer function poles and transfer function zeros of both the IIR band stop filter 66 and the phase equalizer 74 are combined to provide a phase linear IIR filter. In some embodiments, the all pass phase equalizer 74 is an all pass phase equalizer. In some embodiments, the all pass phase equalizer 74 is configured as a sum of two all pass filters using a Hilbert transform. In some embodiments, each band stop filter 66 includes a cascade of band stop filters 66. In some embodiments, each band stop filter 66 is an infinite impulse response, IIR, filter having quantized poles inside a unit circle centered at the origin of a complex plane. In some embodiments, each band stop filter 66 is a finite impulse response. FIR, filter. In some embodiments, each band stop filter 66 is a finite impulse response, FIR, filter, implemented in the frequency domain using a cascade of a Fast Fourier Transform, FFT, and an inverse FFT.

According to another aspect, a network node 16 is configured to communicate with a wireless device. The network node 16 includes: a time domain beamformer 64 configured to beam-form a plurality of signals to produce a plurality of time domain beamformer output signals; a plurality of band stop filters 66, each band stop filter 66 of the plurality of band stop filters 66 being configured to receive an output signal of the time domain beamformer 64; a plurality of group delay filters 68, each group delay filter 68 of the plurality of group delay filters 68 receiving an output signal of the time domain beamformer 64 and being in electrical parallel with a band stop filter 66 of the plurality of band stop filters 66; and a plurality of summation circuits 70, each summation circuit 70 configured to subtract an output of a band stop filter 66 of the plurality of band stop filters 66 from an output of a corresponding group delay filter 68 of the plurality of group delay filters 68.

According to this aspect, in some embodiments, the network node 16 also includes circuitry 72, e.g., baseband zero insertion multiplexer, to insert zeros to a signal that is processed to be input to the time domain beamformer 64 to produce an output of the summation circuits that achieves a specified level of suppression of out-of-band emissions using a band stop filter 66 that is of lower order than a band stop filter 66 that achieves the specified level of suppression of out-of-band emission when no zeros are inserted to the signal. In some embodiments, each band stop filter 66 of the plurality of band stop filters includes an infinite impulse response, IIR, band stop filter 66 in electrical series with an all pass phase equalizer 74. In some embodiments, a stop band of a band stop filter 66 of the plurality of band stop filters is configured to encompass a pass band of a time domain beamformer output signal that is input to the band stop filter 66.

According to yet another aspect, a method in a network node 16 configured to communicate with a wireless device is provided. The method includes: beamforming a plurality of signals to produce a plurality of time domain beamformer output signals; filtering each signal of the plurality of signals by a band stop filter 66, each band stop filter 66 being configured to receive an output signal of the time domain beamformer 64; group delay-filtering each signal of the plurality of signals by a of group delay filter 68, each group delay filter 68 being configured to receive an output signal of the time domain beamformer 64 and being in electrical parallel with a band stop filter 66; and for each band stop filter 66, subtracting an output of a band stop filter 66 from an output of a corresponding group delay filter 68.

According to this aspect, in some embodiments, the method also includes inserting zeros to a signal that is processed to be input to the time domain beamformer 64 to produce an output of the subtracting that achieves a specified level of suppression of out-of-band emissions using a band stop filter 66 that is of lower order than a band stop filter 66 that achieves the specified level of suppression of out-of-band emission when no zeros are inserted to the signal. In some embodiments, each band stop filter 66 includes an infinite impulse response, IIR, band stop filter 66 in electrical series with an all pass phase equalizer 74. In some embodiments, a stop band of a band stop filter 66 is configured to encompass a pass band of a time domain beamformer output signal that is input to the band stop filter 66.

Some abbreviations that may be used herein are defined as follows:

3GPP Third Generation Partnership Project
BF Beamforming
CFR Crest Factor Reduction
DAC Digital-to-Analog Converter
DPD Digital Pre-Distortion
FCC Federal Communications Commission
FD Frequency-Domain
FDC Forward Distortion Correction
FIR Finite Impulse Response
IFFT Inverse Fast Fourier Transform
IIR Infinite Impulse Response
OBUE Operating Band Unwanted Emissions
TD Time-Domain As will be appreciated by one of skill in the art, the concepts described herein may be embodied as a method, data processing system, and/or computer program product. Accordingly, the concepts described herein may take the form of an entirely hardware embodiment, an entirely software embodiment or an embodiment combining software and hardware aspects all generally referred to herein as a "circuit" or "module." Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A method in a network node configured to communicate with a wireless device, the network node comprising a time domain beamformer, the method comprising:

filtering each signal output by the time domain beamformer by a band stop filter, the band stop filter including a stop band overlapping a pass band of the signal output by the time domain beamformer;

filtering each signal output by the time domain beamformer by a group delay filter in electrical parallel with a band stop filter, the group delay filter providing a group delay to the signal output by the time domain beamformer; and subtracting an output of each band stop filter from an output of a corresponding group delay filter.

2. The method of claim 1, further comprising inserting zeros to a signal that is processed to be input to the time domain beamformer to achieve a specified level of suppression of out-of-band emissions using a band stop filter that is of lower order than a band stop filter that achieves the specified level of suppression of out-of-band emission when no zeros are inserted to the signal.

3. The method of claim 1, wherein portions of the signal output by the time domain beamformer in a vicinity of time domain beam weight transitions are filtered to improve an Error Vector Magnitude (EVM) of the signal.

4. A network node configured to communicate with a wireless device, the network node configured to implement a time domain beamformer, the network node comprising circuitry configured to:

filter each signal output by the time domain beamformer by a band stop filter, the band stop filter including a stop band overlapping a pass band of the signal output by the time domain beamformer;

filter each signal output the time domain beamformer by a group delay filter in electrical parallel with a band stop filter, the group delay filter providing a group delay to the signal output by the time domain beamformer; and subtract an output of each band stop filter from an output of a corresponding group delay filter.

5. The network node of claim 4, wherein the circuitry is further configured to insert zeros to a signal that is processed to be input to the time domain beamformer to achieve a specified level of suppression of out-of-band emissions using a band stop filter that is of lower order than a band stop filter that achieves the specified level of suppression of out-of-band emission when no zeros are inserted to the signal.

6. The network node of claim 4, wherein each band stop filter includes an infinite impulse response, (IIR), band stop filter in electrical series with a phase equalizer.

7. The network node of claim 6, wherein transfer function poles and transfer function zeros of both the IIR band stop filter and the phase equalizer are combined to provide a phase linear IIR filter.

8. The network node of claim 6, wherein the phase equalizer is an all pass phase equalizer.

9. The network node of claim 8, wherein the all pass phase equalizer is configured as a sum of two all pass filters using a Hilbert transform.

10. The network node of claim 4, wherein each band stop filter includes an infinite impulse response, (IIR), band stop filter implemented using zero-phase IIR filtering, thereby doubling the filter order and providing zero phase distortion.

11. The network node of claim 4, wherein each band stop filter includes a cascade of band stop filters.

12. The network node of claim 4, wherein each band stop filter is an infinite impulse response (IIR) filter having quantized poles inside a unit circle centered at an origin of a complex plane.

13. The network node of claim 4, wherein each band stop filter is a finite impulse response (FIR) filter.

14. The network node of claim 4, wherein each band stop filter is a finite impulse response (FIR) filter, implemented in the frequency domain using a cascade of a Fast Fourier Transform (FFT) and an inverse FFT, following one of an overlap and save method and an overlap and add method.

15. The network node of claim 4, wherein portions of the signal output by the time domain beamformer in a vicinity of time domain beam weight transitions are filtered to improve an Error Vector Magnitude (EVM) of the signal.

16. A network node configured to communicate with a wireless device, the network node comprising:

a time domain beamformer configured to beam-form a plurality of signals to produce a plurality of time domain beamformer output signals;

a plurality of band stop filters, each band stop filter of the plurality of band stop filter being configured to receive an output signal of the time domain beamformer;

a plurality of group delay filters, each group delay filter of the plurality of group delay filters receiving an output signal of the time domain beamformer and being in electrical parallel with a band stop filter of the plurality of band stop filters; and a plurality of summation circuits, each summation circuit configured to subtract an output of a band stop filter of the plurality of band stop filters from an output of a corresponding group delay filter of the plurality of group delay filters.

17. The network node of claim 16, further comprising circuitry to insert zeros to a signal that is processed to be input to the time domain beamformer to produce an output of the summation circuits that achieves a specified level of suppression of out-of-band emissions using a band stop filter that is of lower order than a band stop filter that achieves the specified level of suppression of out-of-band emission when no zeros are inserted to the signal.

18. The network node of claim 16, wherein each band stop filter of the plurality of band stop filters includes an infinite impulse response (IIR) band stop filter in electrical series with an all pass phase equalizer.

19. The network node of claim 16, wherein a stop band of a band stop filter of the plurality of band stop filters is configured to encompass a pass band of a time domain beamformer output signal that is input to the band stop filter.

20. A method in a network node configured to communicate with a wireless device, the method comprising:

beamforming a plurality of signals to produce a plurality of time domain beamformer output signals;

filtering each signal of the plurality of signals by a band stop filter, each band stop filter being configured to receive an output signal of the time domain beamformer;

group delay-filtering each signal of the plurality of signals by a of group delay filter, each group delay filter being configured to receive an output signal of the time domain beamformer and being in electrical parallel with a band stop filter; and for each band stop filter, subtracting an output of a band stop filter from an output of a corresponding group delay filter.

21. The method of claim 20, further comprising inserting zeros to a signal that is processed to be input to the time domain beamformer to produce an output of the subtracting that achieves a specified level of suppression of out-of-band emissions using a band stop filter that is of lower order than a band stop filter that achieves the specified level of suppression of out-of-band emission when no zeros are inserted to the signal.

22. The method of claim 20, wherein a stop band of a band stop filter is configured to encompass a pass band of a time domain beamformer output signal that is input to the band stop filter.

* * * * *